United States Patent [19]
Wai et al.

[11] Patent Number: 5,455,741
[45] Date of Patent: Oct. 3, 1995

[54] WIRE-LEAD THROUGH HOLE INTERCONNECT DEVICE

[75] Inventors: Ka K. Wai; Moin Ahmad; Aurelio J. Gutierrez; James D. Lint, all of San Diego, Calif.

[73] Assignee: Pulse Engineering, Inc., San Diego, Calif.

[21] Appl. No.: 143,306

[22] Filed: Oct. 26, 1993

[51] Int. Cl.$^6$ .............................. H05K 1/18; B65D 73/02
[52] U.S. Cl. .................. 361/761; 29/837; 29/842; 29/845; 437/180; 437/203; 361/807; 361/809; 174/260; 174/262; 174/263
[58] Field of Search .................................. 206/328–331; 174/250, 255, 260–263, 266; 361/760–764, 807–812, 741, 756, 802; 29/837, 842, 845; 437/180, 203

[56] References Cited

U.S. PATENT DOCUMENTS

| | | | |
|---|---|---|---|
| 2,945,163 | 7/1960 | Kilby et al. . | |
| 3,184,532 | 5/1965 | Spera | 206/331 |
| 3,950,269 | 5/1976 | Setterquist | 252/430 |
| 4,084,210 | 4/1978 | Forrest | 206/331 |
| 4,188,470 | 2/1980 | Collina et al. | 526/64 |
| 4,299,936 | 11/1981 | Candlin et al. | 526/119 |
| 4,324,691 | 4/1982 | Hartshorn | 252/429 |
| 4,402,135 | 9/1983 | Schweingruber et al. | 29/832 |
| 4,415,607 | 11/1983 | Denes et al. | 29/832 |
| 4,530,914 | 7/1985 | Ewen et al. | 502/113 |
| 4,532,152 | 7/1985 | Elarde | 29/848 |
| 4,536,484 | 8/1985 | Lacombe et al. | 502/62 |
| 4,540,907 | 9/1985 | Hagenlocher et al. . | |
| 4,591,220 | 5/1986 | Impey | 29/848 |
| 4,604,799 | 8/1986 | Gurol | 29/897 |
| 4,631,639 | 12/1986 | Biraud | 361/807 |
| 4,658,078 | 4/1987 | Slaugh et al. | 585/512 |
| 4,665,047 | 5/1987 | Slaugh et al. | 502/108 |
| 4,668,328 | 8/1987 | Jebens et al. | 29/839 |
| 4,688,867 | 8/1987 | Reichardt . | |
| 4,689,103 | 8/1987 | Elarde | 29/848 |
| 4,694,572 | 9/1987 | Leber et al. | 29/840 |
| 4,710,552 | 12/1987 | Bachl et al. | 526/116 |
| 4,752,597 | 6/1988 | Turner | 502/104 |
| 4,769,510 | 9/1988 | Kaminsky et al. | 585/512 |
| 4,791,248 | 12/1988 | Oldenettel | 427/97 |
| 4,794,096 | 12/1988 | Ewen | 502/117 |
| 4,812,950 | 3/1989 | Oyamada | 361/807 |
| 4,814,540 | 3/1989 | Watanabe et al. | 585/523 |
| 4,870,751 | 10/1989 | Antoon | 29/846 |
| 4,871,704 | 10/1989 | Kohara et al. | 502/114 |
| 4,886,686 | 12/1989 | Muensted . | |
| 4,912,075 | 3/1990 | Chang | 502/107 |
| 4,912,288 | 3/1990 | Atkinson et al. | 174/251 |
| 4,914,253 | 4/1990 | Chang | 585/523 |
| 4,923,833 | 5/1990 | Kioka et al. | 502/9 |
| 4,925,821 | 5/1990 | Chang | 502/107 |

(List continued on next page.)

FOREIGN PATENT DOCUMENTS 0515132 11/1992 European Pat. Off. .
0516458 12/1992 European Pat. Off. .

OTHER PUBLICATIONS

"Molded Circuits What Ever Happened to Molded 3D Circuitboards?" by Carl Kirkland, Plastics World/Feb., 1993 pp. 32–36.
Kaminsky, W. Dr., "Metallocene Catalysts", Global Business Chamges, Monomers, Polymers, Markets and Applications, III-3.1–III-3.21, Dec. 1992.

*Primary Examiner*—Bot Ledynh
*Attorney, Agent, or Firm*—Baker, Maxham, Jester & Meador

[57] ABSTRACT

An electronic device comprises a three dimensional electronic element holder of a non-conducting material having at least one cavity in a first surface and a plurality of lead through holes with inlet guides extending from the cavity to a second surface having a circuit thereon, an electronic element mounted in the cavity and having a plurality of leads, a plurality of the leads extending via the through holes from the element to the second surface, and a plurality of lead terminal recesses formed at the second surface for for receiving and forming terminal ends and connections of the leads to the circuit on the second surface.

20 Claims, 2 Drawing Sheets

U.S. PATENT DOCUMENTS

| | | | |
|---|---|---|---|
| 4,931,517 | 6/1990 | Fujita | 526/128 |
| 4,933,403 | 6/1990 | Kaminsky et al. | 526/160 |
| 4,935,397 | 6/1990 | Chang | 502/117 |
| 4,937,217 | 6/1990 | Chang | 502/111 |
| 4,937,301 | 6/1990 | Chang | 526/128 |
| 4,962,248 | 10/1990 | Winter et al. | 585/12 |
| 4,962,262 | 10/1990 | Winter et al. | 585/512 |
| 4,985,600 | 1/1991 | Heerman | 174/255 |
| 4,996,391 | 2/1991 | Schmidt | 174/255 |
| 5,001,205 | 3/1991 | Hoel | 526/128 |
| 5,003,693 | 4/1991 | Atkinson et al. | 29/849 |
| 5,006,500 | 4/1991 | Chang | 502/107 |
| 5,008,228 | 4/1991 | Chang | 502/111 |
| 5,008,496 | 4/1991 | Schmidt et al. | 174/254 |
| 5,023,388 | 6/1991 | Luker | 585/9 |
| 5,026,797 | 6/1991 | Takahashi | 526/124 |
| 5,043,515 | 8/1991 | Slaugh et al. | 585/512 |
| 5,055,438 | 10/1991 | Canich | 502/117 |
| 5,057,475 | 10/1991 | Canich et al. | 502/104 |
| 5,066,631 | 11/1991 | Sangokoya et al. | 502/152 |
| 5,086,024 | 2/1992 | Crapo et al. | 502/117 |
| 5,086,135 | 2/1992 | Kissin | 526/151 |
| 5,087,788 | 2/1992 | Wu | 585/512 |
| 5,091,352 | 2/1992 | Kioka et al. | 502/103 |
| 5,118,903 | 6/1992 | Schupp et al. | |
| 5,126,303 | 6/1992 | Resconi et al. | 502/117 |
| 5,132,262 | 7/1992 | Rieger et al. | 502/117 |
| 5,132,381 | 7/1992 | Winter et al. | 526/160 |
| 5,141,829 | 8/1992 | Dumas et al. | 427/96 |
| 5,145,819 | 9/1992 | Winter et al. | 502/117 |
| 5,147,949 | 9/1992 | Chang | 526/129 |
| 5,157,008 | 10/1992 | Sangokoya et al. | 502/111 |
| 5,171,799 | 12/1992 | Kioka et al. | 26/127 |
| 5,171,871 | 12/1992 | Miyashita | 556/27 |
| 5,171,919 | 12/1992 | Watanabe et al. | 585/523 |
| 5,176,254 | 1/1993 | Caravona . | |
| 5,178,976 | 1/1993 | Rose et al. . | |
| 5,196,496 | 3/1993 | Galimberti et al. | 526/348 |
| 5,198,399 | 3/1993 | Hoff et al. | 502/111 |
| 5,206,197 | 4/1993 | Campbell, Jr. | 502/103 |
| 5,206,199 | 4/1993 | Kioka et al. | 502/117 |
| 5,208,304 | 5/1993 | Waymouth | 526/164 |
| 5,216,095 | 6/1993 | Dolle et al. | 526/127 |
| 5,223,465 | 6/1993 | Ueli et al. | 502/117 |
| 5,225,500 | 7/1993 | Elder et al. | 526/127 |
| 5,234,878 | 8/1993 | Tsutsui et al. | 502/103 |
| 5,238,891 | 8/1993 | Miro | 502/104 |
| 5,238,892 | 8/1993 | Chang | 502/111 |
| 5,240,894 | 8/1993 | Burkhardt et al. | 502/108 |
| 5,241,025 | 8/1993 | Hlatky et al. | 526/129 |
| 5,242,876 | 9/1993 | Shamshoum et al. | 502/113 |

WIRE-LEAD THROUGH HOLE INTERCONNECT DEVICE

BACKGROUND OF THE INVENTION

The present invention relates to non-semiconductor electrical and electronic elements and pertains particularly to an improved package and method of packaging of microminiature electronic components.

For many years, electronic circuit boards have been fabricated by interconnecting a plurality of electronic components, both active and passive, on a planar printed circuit board. Typically, this printed circuit board has comprised an Epoxy/fiberglass laminate substrate clad with a sheet of copper, which as been etched to delineate the conduct paths. Holes were drilled through terminal portions of the conductive paths for receiving electronic component leads which were subsequently soldered thereto.

More recently, so-called surface mount technology has evolved to permit more efficient automatic mass production of circuit boards with higher component densities. With this approach, certain packaged components are automatically placed at preselected locations on top of a printed circuit board so that their leads are registered with, and lie on top of corresponding solder paths. The printed circuit board is then processed by exposure to infrared or vapor phase soldering techniques to re-flow the solder and thereby establish a permanent electrical connection between the leads and their corresponding conductive paths on the printed circuit board.

Dual in-line chip carrier packages have existed for many years. The most common example is an integrated circuit, which is bonded to a ceramic carrier and electrically connected to a lead frame providing opposite rows of parallel electrical leads. The integrated circuit and ceramic carrier are normally encased in a black, rectangular plastic housing from which the leads extend. Typically, these dual in-line packages are mounted horizontally, i.e. with the leads extending co-planar with the printed circuit board. Such dual in-line packages have heretofore been attached to printed circuit boards by surface mounting techniques.

The increasing miniaturization of electrical and electronic elements and high density mounting thereof have created increasing problems with electrical isolation and mechanical interconnection. In particular, these trends create more difficulty establishing reliable and efficient connection between fine gauge (AWG 24 to AWG 50) copper wires and egress hardware or terminals. Presently known interconnect methods severely limit the ability to provide dense and reliable electrical and mechanical isolation between distinct egress or terminal points due to space limitations.

One of the prior art approaches is to extend a fine copper wire forming the element lead and to wrap or coil it around a terminal pin of a terminal and apply solder to the connection. This requires space that is not always available and does not allow adequate separation for high voltages that may be required in the circuit. Another problem with this approach is that element leads are frequently broken or sheared during a subsequent encapsulation process. In addition, the lead is also frequently broken as the result of thermal expansion and contraction of the leads and/or terminals.

Referring to FIG. 1 of the drawing, a typical mounting of electrical component to a substrate or carrier is illustrated. A substrate 10, which may be a typical printed circuit (PC) board or a carrier for carrying components to be mounted to a PC board, is provided with one or more through holes 12 for mounting of leads or wires from electrical components. The through hole may be either plated or non-plated and typically intersects or provides a connective terminal to a circuit strip or pad on one of the opposing surfaces of the substrate 10. In the illustrated embodiment, the electrical or electronic component 14 has a lead or wire 16 that extends through the through hole 12 where a solder joint is formed by the application of molten solder at 18. The solder may be applied in any number of ways, such as reflow, direct soldering or through a solder well. As can be seen, the solder joint protrudes from the bottom surface of the substrate 10 and thus forms a true protrusion or bump on the surface thereof.

It is, therefore, desirable that an improved package and method of packaging of miniature and microminiature electronic components be available.

SUMMARY AND OBJECTS OF THE INVENTION

It is the primary object of the present invention to provide an improved package and method of packaging of microminiature electronic components.

In accordance with a primary aspect of the present invention, a miniature electronic device having a plurality of leads comprises a three dimensional electronic element holder of a non-conducting material, having at least one cavity therein and a plurality of through holes having lead guides extending from the cavity to a base of the holder, an electronic element mounted in the cavity, with a plurality of leads extending via the through holes from the element to the base, and a recessed solder joint of lead terminals at the opposite face of the holder.

BRIEF DESCRIPTION OF THE DRAWING

The above and other objects and advantages of the present invention will become apparent from the following description when read in conjunction with the accompanying drawings wherein.

DESCRIPTION OF THE PREFERRED EMBODIMENTS

Figure 1:
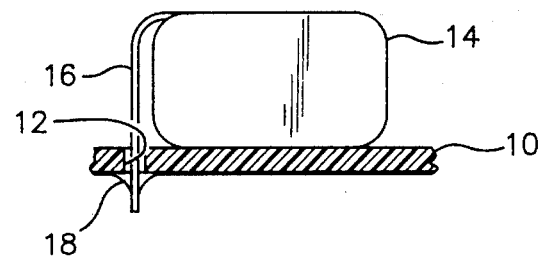
FIG. 1 is a perspective view illustrating the soldering of a component lead in a PC board through hole in accordance with the prior art approach.
Figure 2:
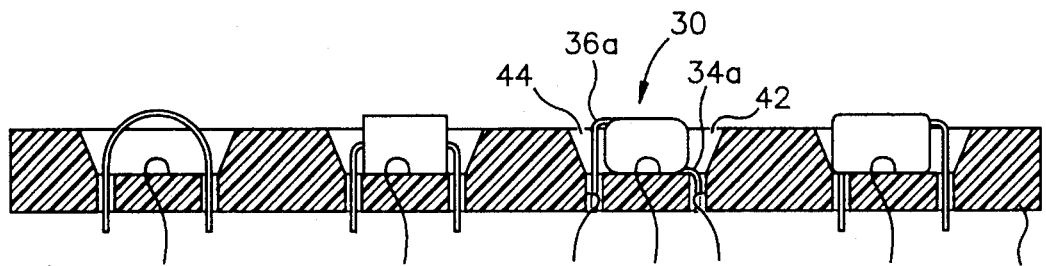
FIG. 2 is a vertical sectional view illustrating major components and initial steps in assembling a preferred embodiment of the present invention.
Figure 3:
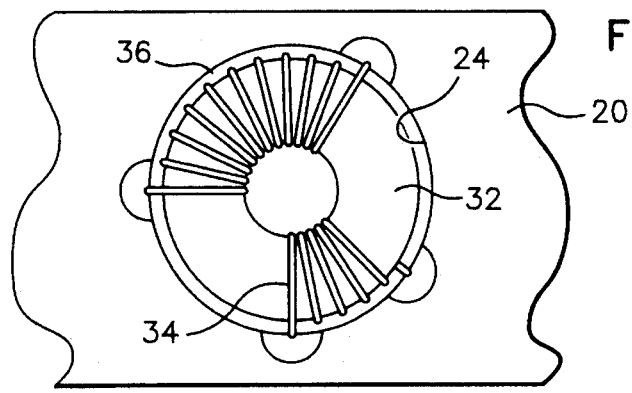
FIG. 3 is a top plan view illustrating additional aspects of the preferred embodiment of the present invention.

Referring to FIG. 2 of the drawings, a preferred embodiment of the present invention is illustrated wherein a substrate or carrier 20 is formed with a plurality of cavities or recesses 22, 24, 26 and 28. The carrier 20 is made of non-conducting material. The cavities 22, 24, 26 and 28 are each provided with at least one and preferably two through holes. In the preferred embodiment, the cavity or recess 24 and the associated electrical element or component will be described in detail. The cavity or recess 24 is designed to receive a component which is illustrated as a microminiature inductance coil 30. The toroidal coil 30 is formed of a toroidal core 32 (FIG. 3) on which is formed a pair of separately wound coils 34 and 36. The coils terminate at both ends with a lead or wire, only two of which are illustrated, which extends through through holes provided in the cavity 24.

In the preferred embodiment, the recesses are provided with four through holes, two of which 38 and 40 are illustrated in FIG. 2. These two through holes receive coil leads 34a and 36a, respectively. These leads are threaded through the through holes and are joined by solder joint to a circuit element on the bottom surface of the substrate or carrier 20. The through holes are each provided with guide means which in the illustrated form embodiment take the form of semi-conical surfaces 42 and 44 (FIG. 2).

Figure 4:
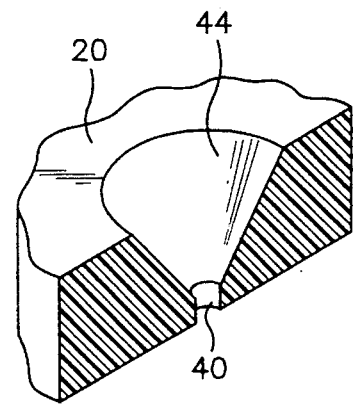
FIG. 4 is an exploded perspective view illustrating further aspects of the preferred embodiment of the present invention.

As best seen in FIG. 4, guide 44 for through hole 40 has the form of one-half of a cone cut along its longitudinal axis. The guide 44 together with the through hole 40 has a typical funnel configuration. In the typical application of the guided through hole, the through hole will be positioned adjacent a wall of the cavity with the guide formed as a semi-cone or conical recess in the peripheral wall of the cavity.

The guides for the through holes enable a quick and easy insertion of the leads of the component into the respective through holes as the component is placed in the cavity. This will reduce labor time required to insert wires or leads in the through holes. It also improves the repeatability and reliability of the positioning and insertion of wires and leads in the through holes. This significantly improves the reliability and accuracy of feeding the wires through either manually or with automatic machine assembly.

Figure 5:
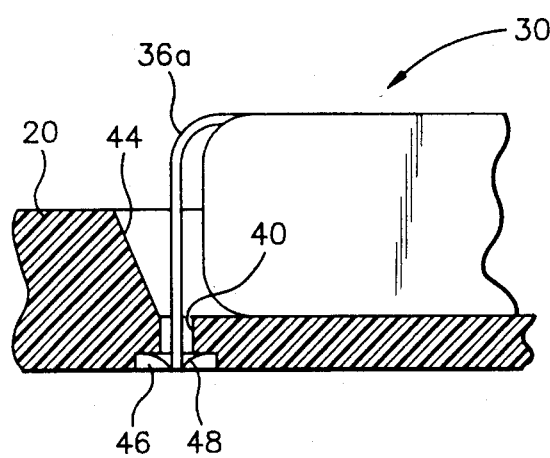
FIG. 5 is an enlarged vertical sectional view illustrating details of a terminal connection in accordance with the preferred embodiment of the present invention.

Referring to FIG. 5 in the preferred embodiment, the substrate 20 is provided with recesses 46 at the lower end of each of the through holes. More particularly, through hole 40 is provided with a recess 46 for receiving the terminal end of the lead 36 so that it may be cut to length below the lower surface of the substrate 20 and soldered with a solder joint 48 that is within the recess and keeps the bottom surface of the substrate clear and flat. Thus, the guides for each of the through holes permit easy mechanical or manual insertion of the respective components into their respective cavities. The substrate or carrier can then be soldered by any suitable process for providing the component connection in the respective circuit. In the preferred embodiment, the printed circuit elements of the circuit may be recessed into grooves or recesses that intersect and connect to the solder joint recesses such that the entire surface of the substrate or carrier is completely flat and free of bumps or protrusions. A thin non-conductive insulating film (not shown) can then be placed over the entire lower surface of the substrate to protectively cover the circuit thereon.

Figure 6:
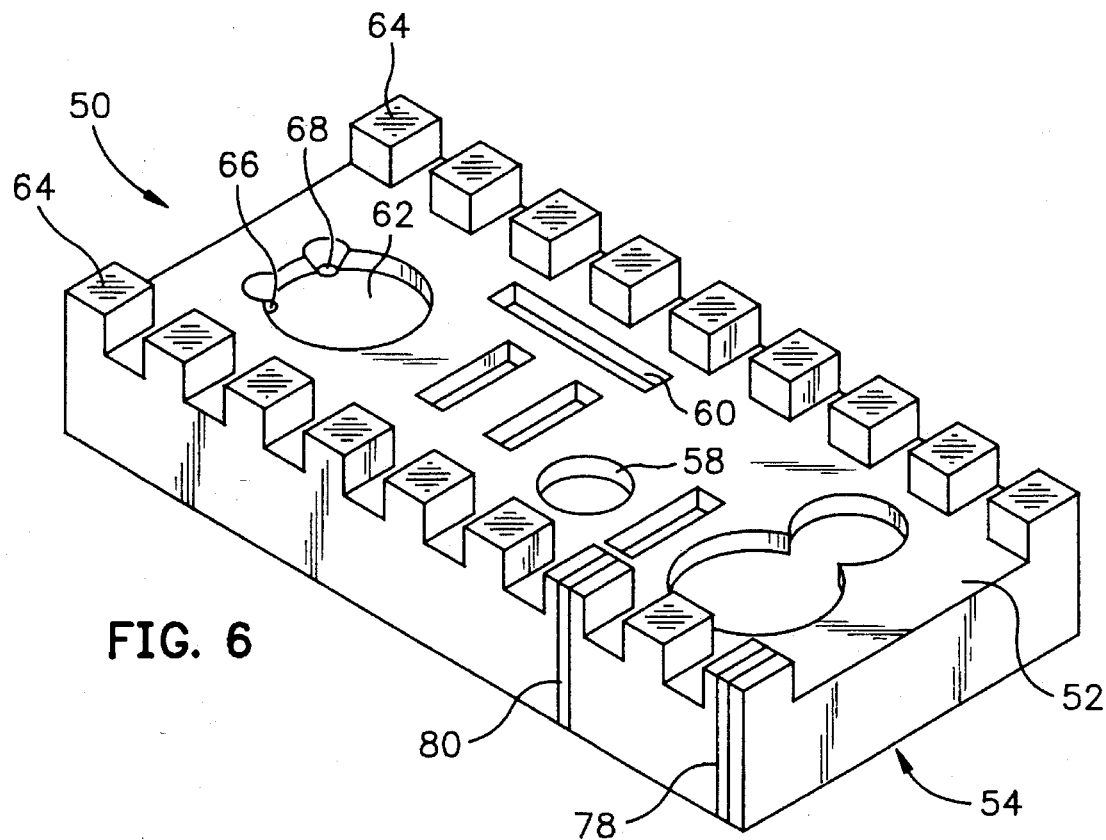
FIG. 6 is a perspective view illustrating the top surface of an alternate embodiment of the present invention.
Figure 7:
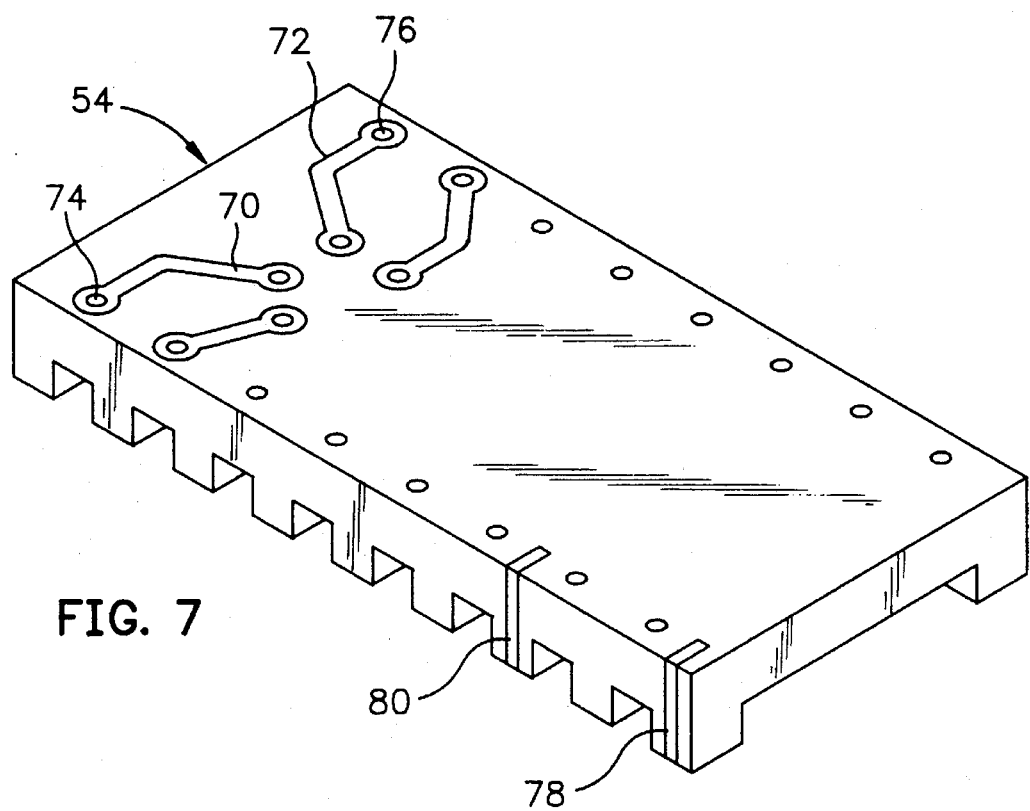
FIG. 7 is a perspective view illustrating a bottom surface of the alternate embodiment of the present invention.

In an alternate embodiment of the invention illustrated in FIG. 6, a carrier designated generally at 50 is formed as a three-dimensional body having first and second surfaces 52 and 54. One of the surfaces, 52, is provided with one or more electrical or electronic component receiving cavities 58, 60 and 62. Only a few of the illustrated cavities will be referred to specifically and only one will be described in detail. In the alternate embodiment of FIG. 6, the surface 52 is also provided with a plurality of metallized pads 64 along both sides thereof for surface mounting of the carrier 50 to a PC board. A suitable printed circuit may be formed on the bottom surface of the carrier 54, as shown in FIG. 7. The cavity 62 (FIG. 6) is provided with a plurality of through holes and associated guides. Two through holes 66 and 68, for example, extend through and connect to circuit elements 70 and 72 (FIG. 7) on the bottom surface of the carrier 54. These circuit elements or conductors may extend out to and connect through by way of through holes 74 and 76 to pads 64 on the top surface of the carrier. Alternatively, these may be connected by printed conductive strips 78 and 80 extending along the sides of the carrier or by metal clips or the like. The cavities are preferably of a depth to completely receive the respective electrical or electronic component below the respective surface thereof. In addition, the leads are terminated and conductively connected to the respective circuit strips in a recess as previously described. Both surfaces of the carrier can then be completely covered by an insulating film bonded thereto. The film may serve as an insulator and additionally as a label for the product.

From the above description, it is seen that we have a miniature electronic unit package for high density mounting and an improved method of forming an assembling such a package. The embodiments disclosed herein are preferably injection molded from a suitable plastic that can readily be plated with copper, such as polyimide. While we have illustrated and described our invention by means of specific embodiments, it is to be understood that numerous changes and modifications may be made therein without departing from the spirit and scope of the invention as defined in the appended claims.

We claim:

1. A holder for mounting an electronic element having a plurality of leads, comprising:

a three dimensional body formed of a non-conducting material and having top and bottom surfaces and' at least one cavity in one of said top and bottom surfaces;

a plurality of lead through holes extending from said cavity to the other of said top and bottom surfaces; and semi-conical guide means within said cavity for guiding leads into said through holes.

2. An electronic holder according to claim 1 wherein said guide means is a semi-conical recess formed in a wall of said cavity.

3. An electronic holder according to claim 2 wherein said holder has a generally rectangular box-like outer configuration and further comprising a printed circuit on said other of said top and said bottom surfaces.

4. An electronic holder according to claim 3 wherein the other of said top and said bottom surfaces is formed with a solder joint recess at one end of each of said through holes for receiving an end of a lead and maintaining a joint of said lead below the said other of said top and said bottom surfaces.

5. An electronic holder according to claim 4 wherein said holder includes a plurality of said cavities, and each cavity includes a plurality of said through holes.

6. An electronic holder according to claim 4 wherein said holder includes a plurality of metallized bonding pads extending from one of said surfaces.

7. An electronic holder according to claim 1 further comprising an electronic element mounted in said cavity; and a plurality of leads extending from said electronic element via said through holes to the other of said top and bottom surfaces.

8. An electronic holder according to claim 7 wherein said guide means is a semi-conical recess formed in a wall of said cavity.

9. An electronic holder according to claim 8 wherein said holder includes a plurality of said cavities, and an electronic element mounted in each of said cavities.

10. An electronic holder according to claim 8 wherein said holder has a generally rectangular box-like outer configuration and and further comprising a printed circuit on said other of said top and said bottom surfaces.

11. An electronic holder according to claim 10 wherein the other of said top and said bottom is formed with a solder joint recess at one end of each of said through holes for receiving an end of a lead and maintaining a joint of said lead below the surface of the said other of said top and said bottom surfaces.

12. An electronic holder according to claim 11 wherein said electronic element is a microminiature inductance coil.

13. An electronic holder according to claim 11 wherein said holder includes a plurality of bonding pads extending from one of said surfaces.

14. An electronic holder according to claim 11 further comprising an insulating film covering at least said other of said top and said bottom surfaces.

15. An electronic package including at least one electronic element having a plurality of leads connected to conducting terminals, comprising:

a three dimensional body of a non-conducting material having a generally rectangular box-like outer configuration with a top surface and a bottom surface and at least one cavity in one of said top and bottom surfaces thereof;

a plurality of lead through holes extending from said cavity to the other of said top and bottom surface;

semi-conical guide means within said cavity for guiding leads into said through holes;

a printed circuit on said other of said top and said bottom surfaces;

an electronic element having a plurality of conductive leads mounted in said cavity;

a plurality of said leads extending from said element to said the other of said top and bottom surfaces via said through holes; and a solder joint recess at one end of each of said through holes for receiving and maintaining a joint of said lead to said circuit below the surface of the said other of said top and said bottom surfaces.

16. An electronic package according to claim 15 wherein said guide means is a semi-conical recess formed in a wall of said cavity.

17. An electronic package according to claim 15 wherein said holder includes a plurality of metallized bonding pads extending from one of said surfaces.

18. An electronic package according to claim 15 further comprising an insulating film covering at least said other of said top and said bottom surfaces.

19. An electronic package according to claim 15 wherein said electronic element is a microminiature inductance coil.

20. A method of making an electronic package comprising the steps of:

forming a three dimensional electronic element holder of a non-conducting material having a generally rectangular box-like outer configuration and having a top surface and a bottom surface;

forming at least one cavity in a top surface thereof with a plurality of lead through holes extending from said cavity to one of said top and bottom surfaces;

forming semi-conical guide means within said cavity for guiding leads into said through holes;

forming a printed circuit on said other of said top and said bottom surfaces;

forming recesses at the end of said through holes in said other of said top and said bottom surfaces said other of said top and said bottom surfaces;

selecting and mounting an electronic element having a plurality of conductive leads in said cavity in said holder;

selectively extending said leads from said element to said other of said top and said bottom surfaces via said through holes; and forming a solder joint of each of said leads in said recess at said one end of each of said through holes for receiving and maintaining a joint of said lead to said circuit below the surface of the said other of said top and said bottom surfaces.

* * * * *